United States Patent
Iyer

(10) Patent No.: US 7,382,197 B2
(45) Date of Patent: Jun. 3, 2008

(54) ADAPTIVE TUNING CIRCUIT TO MAXIMIZE OUTPUT SIGNAL AMPLITUDE FOR AN AMPLIFIER

(75) Inventor: Sitaraman V. Iyer, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 126 days.

(21) Appl. No.: 11/517,885

(22) Filed: Sep. 8, 2006

(65) Prior Publication Data

US 2008/0074195 A1  Mar. 27, 2008

(51) Int. Cl.
*H03F 3/04* (2006.01)
(52) U.S. Cl. ........................ 330/305; 330/310
(58) Field of Classification Search ........... 330/305, 330/310, 150, 98
See application file for complete search history.

(56) References Cited

U.S. PATENT DOCUMENTS

| 4,404,529 | A | * | 9/1983 | Rossum et al. | ............. 330/303 |
| 5,644,267 | A | * | 7/1997 | Brianti et al. | ............... 327/553 |
| 6,081,157 | A | * | 6/2000 | Ikeda et al. | ................. 330/107 |
| 6,087,901 | A | * | 7/2000 | Nakanishi et al. | .......... 330/305 |

* cited by examiner

*Primary Examiner*—Henry K Choe
(74) *Attorney, Agent, or Firm*—Seth Z. Kalson

(57) ABSTRACT

An adaptive tuning circuit to maximize the output signal amplitude of a band-pass amplifier, comprising a control circuit to tune the peak frequency of the amplifier by monitoring the change in the output signal amplitude over two successive time sampling intervals. In some embodiments, the control circuit comprises an envelope detector and a switched capacitor circuit to provide voltages indicative of the difference in the output signal amplitude over two successive time intervals. Other embodiments are described and claimed.

11 Claims, 5 Drawing Sheets

ADAPTIVE TUNING CIRCUIT TO MAXIMIZE OUTPUT SIGNAL AMPLITUDE FOR AN AMPLIFIER

FIELD

Embodiments of the present invention relate to electronic circuits, and more particularly, to adaptive tuning circuits for tuning band-pass amplifiers.

BACKGROUND

Band-pass amplifiers are used in a wide variety of electronic systems. In particular, inductor-load amplifiers may be used to receive and amplify narrow band clock signals in high-speed serial input-output communication links. It is desirable for the peak of the response of the amplifier to match the center frequency of the narrow band clock signal. However, the peak of the response may depend upon the inductance of the inductor-load, as well as the capacitance of capacitors connected in parallel with the inductor-load. Accordingly, once a band-pass amplifier has been fabricated in an integrated circuit process technology, it would be useful to provide a control circuit to adaptively tune the band-pass amplifier when used in a system, so as to match the center frequency of a received narrow band clock signal.

BRIEF DESCRIPTION OF THE DRAWINGS

FIG. 1b illustrates the relative timing diagrams of three clock signals used in the embodiments of FIG. 1a.

FIG. 2 illustrates in more detail an embodiment of the tunable band-pass amplifier in the embodiments of FIG. 1a.

FIG. 3 illustrates in more detail an embodiment of the sampler circuit in the embodiments of FIG. 1a.

FIG. 4 illustrates in more detail an embodiment of the envelope detector in the embodiments of FIG. 1a.

DESCRIPTION OF EMBODIMENTS

In the descriptions that follow, the scope of the term "some embodiments" is not to be so limited as to mean more than one embodiment, but rather, the scope may include one embodiment, more than one embodiment, or perhaps all embodiments.

Figure 1A:
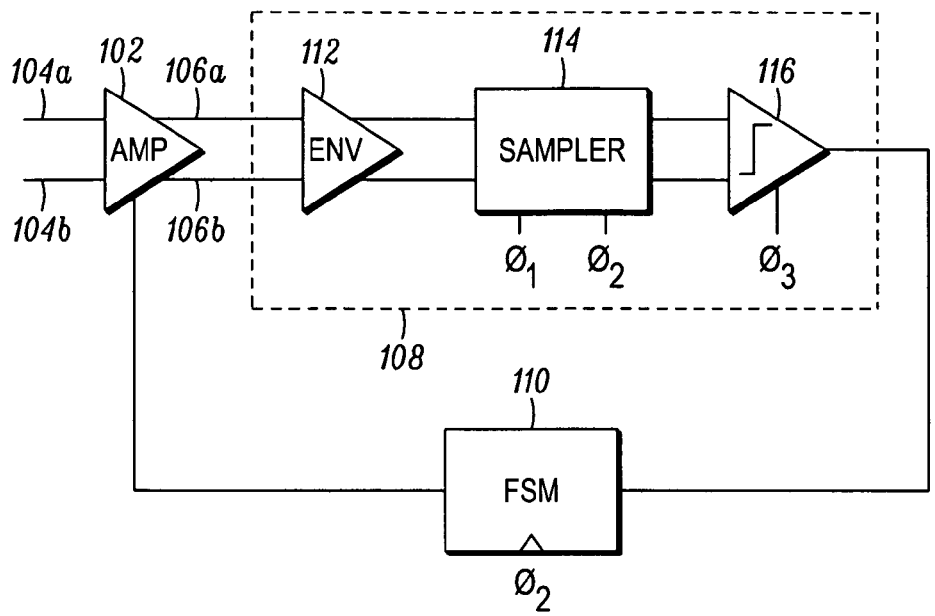
FIG. 1a illustrates some embodiments of the present invention.

FIG. 1a is a high-level abstraction representing some embodiments of the present invention, and depicts a control loop for tuning amplifier 102. Amplifier 102 is a tunable band-pass amplifier. A control loop comprising control circuit 108 and finite state machine 110 tunes amplifier 102. For some embodiments, tuning is accomplished by changing the reactance of a load in amplifier 102, which may be realized by switching in or switching out various capacitive circuits in the reactive load. For other embodiments, tuning of amplifier 102 may be accomplished by changing various bias currents, or perhaps other parameters, of amplifier 102.

Finite state machine 110 has a set of states, and as it sequences through states in the set of states, amplifier 102 is tuned. For some embodiments, finite state machine 110 may comprise a counter having a counter value. For some embodiments, the counter initially counts down from its maximum counter value. Each time its counter value is decremented by one, a capacitive circuit is switched out, and amplifier 102 is tuned so that its peak frequency is shifted higher. Peak frequency refers to the band-pass center frequency of amplifier 102, that is, the frequency for which the transfer function of amplifier 102 has a maximum absolute value.

Amplifier 102 receives a differential input signal at input ports 104a and 104b to provide a differential output signal at its output ports 106a and 106b. While tuning amplifier 102, control circuit 108 samples the amplitude of the differential output signal. For some embodiments, if control circuit 108 detects that the amplitude has decreased from one time interval to the next, then finite state machine 110 is disabled so that tuning of amplifier 102 stops.

In applications where amplifier 102 amplifies a differential clock signal, control circuit 108 disables finite state machine 110 if it detects that tuning has caused the peak frequency to shift past the frequency of the differential clock signal. In this way, it is expected that if the various reactance values available for tuning are properly chosen, amplifier 102 will be tuned so that its peak frequency is close to that of the received clock frequency.

Figure 2:
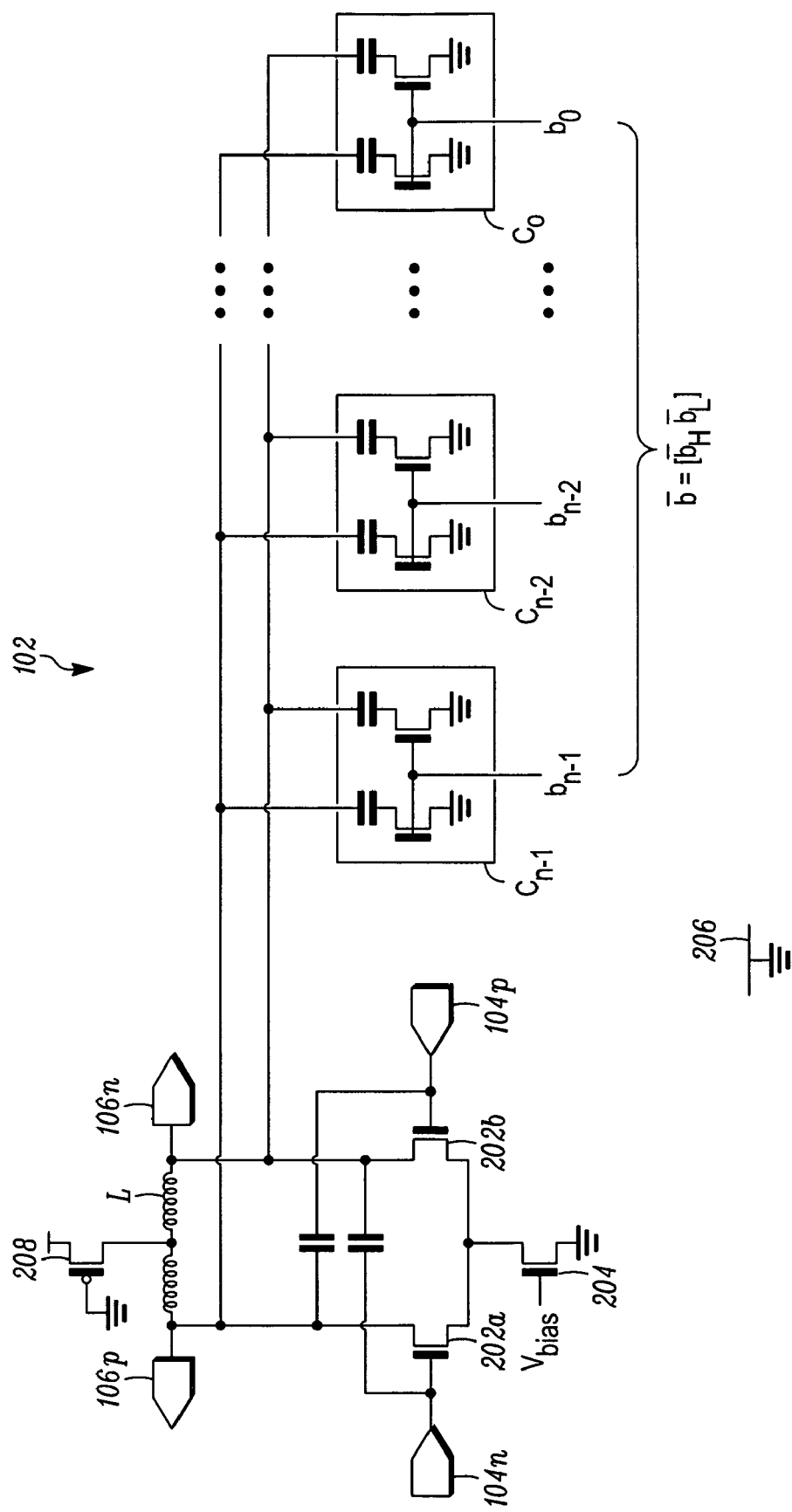

FIG. 2 provides a circuit representation of amplifier 102 according to some embodiments. Amplifier 102 comprises a differential pair, transistors 202a and 202b, with a tail current provided by transistor 204. The gate of transistor 204 is biased by a voltage $V_{BIAS}$. A reactive load comprising inductor L and a set of capacitive circuits $C_j$ loads the drains of the differential pair, where j is an index ranging over the integers 0,1, . . . , n−1. Switching in or switching out capacitive circuits $C_j$ tunes amplifier 102.

Inductor L may in practice comprise two or more discrete inductors. For simplicity, the circuit diagram of FIG. 2 shows inductor L as a center-tapped inductor, but for some embodiments, there may be one inductor coupling one drain of the differential pair to the drain of transistor 208 and a second inductor coupling the other drain of the differential pair to the drain of transistor 208.

A set of control voltages, $[b_{n-1}, b_{n-2}, \ldots, b_0]$ switches in or switches out various capacitive circuits in the set of capacitive circuits $C_j$, where the control voltage $b_j$ is associated with capacitive circuit $C_j$ for each j=0,1, . . . , n−1. Each capacitive circuit $C_j$ comprises two capacitors, one connected to one drain of the differential pair and the other connected to the other drain of the differential pair. For $b_j$ HIGH, its associated capacitive circuit $C_j$ is switched in so that each capacitor in capacitive circuit $C_j$ has a terminal connected to ground (or substrate) 206 via a switch, such as a nMOSFET (n-Metal Oxide Semiconductor Field Effect Transistor) that is switched ON.

The control voltage $b_j$ effectively switches in or switches out its associated capacitive circuit $C_j$. When a capacitive circuit is switched in, a first capacitor within the capacitive circuit is effectively connected in parallel with a first inductive load connected to a first drain of the differential pair, and a second capacitor is effectively connected in parallel with a second inductor connected to a second drain of the differential pair. By switching out more capacitive circuits, the peak frequency (band-pass center frequency) of amplifier 102 shifts higher, whereas by switching in more capacitive circuits, the peak frequency shifts lower.

The particular subset of the set of capacitive circuits that are adaptively switched out is determined by the state of finite state machine 110. As an example, suppose finite state machine 10 comprises a counter where the state is the value of the counter. Let c denote the counter value of counter, and write the set of control voltages $[b_{n-1}, b_{n-2}, \ldots, b_0]$ as $[\bar{b}_H \bar{b}_L]$, where $\bar{b}_L$ is a vector of dimension m where m≦n. For those embodiments for which finite state machine 110 is realized by a counter, the vector $\bar{b}_L$ is set by the counter by establishing a correspondence between the counter value c and $\bar{b}_L$.

This correspondence may be designed in a number of ways. For example, a thermometer encoder may be used to encode the counter value c into a set of m logic voltages, where the counter value is a M bit word where $2^M=m$. The encoding may be chosen such that initially each $[\bar{b}_L]_j$, $j=0,1,\ldots,m-1$, is HIGH, and when the counter is enabled to start counting down, each time the counter value decrements, $[\bar{b}_L]_j$ is brought LOW where $c=j$. If the counter is decremented all the way to zero, then each $[\bar{b}_L]_j$, $j=0,1,\ldots,m-1$, would have been brought LOW, and all capacitive circuits would have been switched out.

The subscripts H and L for $\bar{b}_H$ and $\bar{b}_L$ provide the mnemonic that $\bar{b}_H$ represents the higher indexed voltages in the set $[b_{n-1}, b_{n-2}, \ldots, b_0]$ and $\bar{b}_L$ represents the lower indexed voltages. The higher indexed voltages $\bar{b}_H$ may be chosen by any method, and may be set in a non-adaptive fashion. For some embodiments, the control voltages may be chosen such that choosing the higher indexed voltages $\bar{b}_H$ sets the band of frequencies over which amplifier 102 is tuned. Note that $\bar{b}_H$ may be the null vector if $m=n$, in which case all of the voltages $[b_{n-1}, b_{n-2}, \ldots, b_0]$ are adaptively controlled by the control loop.

Control circuit 108 in the embodiment illustrated in FIG. 1a comprises envelope detector 112, sampler circuit 114, and comparator 116. Representing the differential output signal of amplifier 102 as the differential small-signal voltage $\{v_P(t) v_N(t)\}$, envelope detector 112 provides a differential small-signal envelope $\{e_P(t) e_N(t)\}$ approximately given by $e_P(t)=LP\{|v_P(t)|\}$ and $e_N(t)=-LP\{|v_N(t)|\}$, where LP denotes low pass filtering. The amplitude, a(t), of the differential output signal of amplifier 102 may be defined as $a(t)=e_P(t)-e_N(t)$. Sampler circuit 114 effectively samples the amplitude a(t) over two consecutive time intervals. If the amplitude a(t) decreases from one sampling time interval to the next, then control circuit 108 provides a signal to disable finite state machine 110.

Figure 1B:
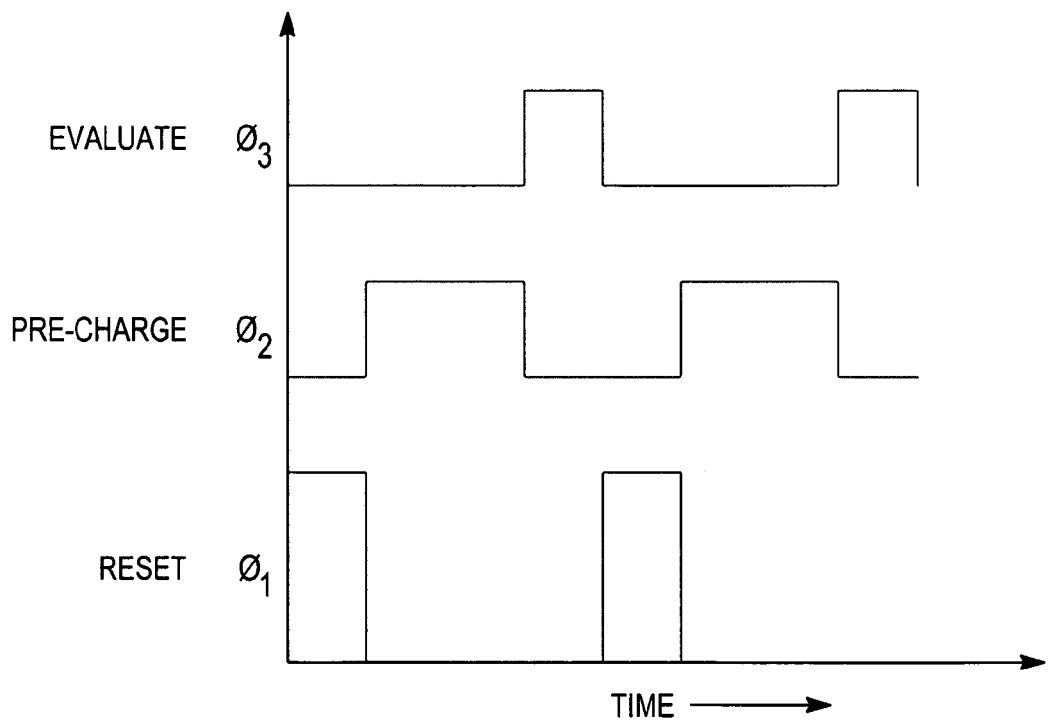
Figure 3:
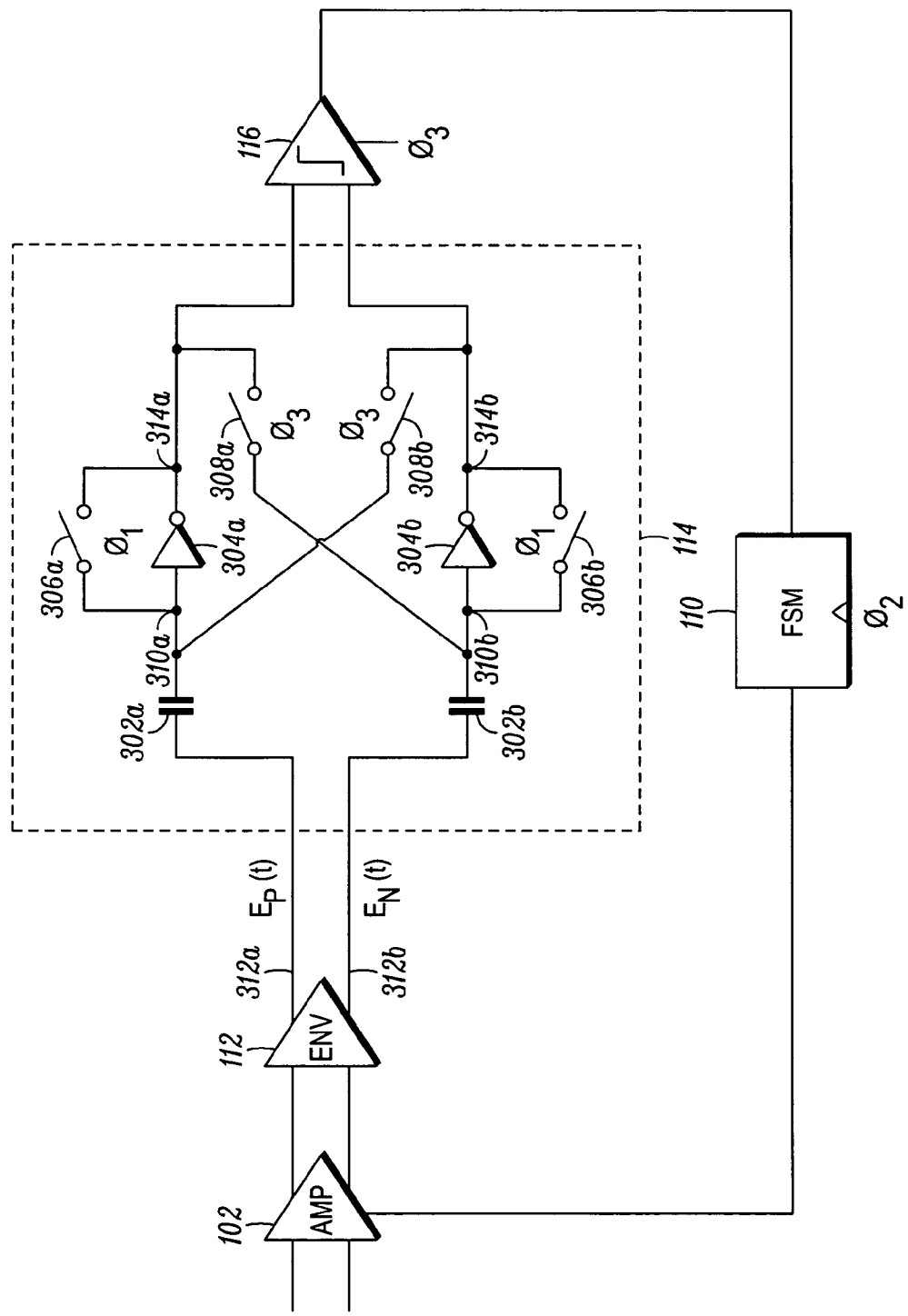

Three clock signals, a reset signal $\phi_1$, a pre-charge signal $\phi_2$, and an evaluate signal $\phi_3$, are utilized in the embodiment of FIG. 1a. FIG. 1b shows the relative timing for these three clock signals. FIG. 3 illustrates sampler circuit 114 in more detail, and how the reset and evaluate clock signals are utilized by sampler circuit 114. Referring to FIG. 3, sampler circuit 114 is a switched capacitor circuit comprising sampling capacitors 302a and 302b, inverters 304a and 304b, switches 306a and 306b that are closed when the reset signal $\phi_1$ is HIGH, and switches 308a and 308b that are closed when the evaluate signal $\phi_3$ is HIGH.

As FIG. 1b shows, during one complete cycle the reset signal will go from LOW to HIGH to LOW, after which the pre-charge signal will go from LOW to HIGH to LOW, and after which the evaluate signal will go from LOW to HIGH to LOW. When the reset signal $\phi_1$ is HIGH, switches 306a and 306b close so that the output port of inverter 304a is connected to its input port, and the output port of inverter 304b is connected to its input port. When switch 306a is closed, node 310a settles to some voltage $V_0$, the voltage for which the output voltage of inverter 304a is equal to its input voltage. Similarly, when switch 306b is closed, node 310b settles to some voltage $V_0'$, the voltage for which the output voltage of inverter 304b is equal to its input voltage. Preferably, inverters 304a and 304b should be matched so that the voltages $V_0$ and $V_0'$ are sufficiently close to each other.

During a reset time interval for which the reset signal is HIGH, capacitor 302a stores a charge Q approximately given by $Q=C(e_P(t_0)-V_0)+Q_0$, where C is the capacitance of capacitor 302a, $e_P(t_0)$ is the small-signal voltage envelope at output port 312a at some time $t_0$ within the reset time interval, and $Q_0$ is some fixed charge due to the common-mode voltage of output port 312a. In a sense, the information represented by $e_P(t_0)$ is stored in capacitor 302a. Similarly, capacitor 302b stores a charge Q' approximately given by $Q'=C(e_N(t_0)-V_0')+Q_0$, where $e_N(t_0)$ is the small-signal voltage envelope at output port 312b at time $t_0$.

In the expressions for Q and Q', for simplicity the capacitance of capacitor 302b is taken to be equal to that of capacitor 302a, and the common-mode voltages for output ports 312a and 312b are taken to be equal, although these are not requirements. Also, the typical convention for distinguishing small-signal voltages from actual voltages is followed, where the variable for a small-signal voltage is lower case and the variable for the actual corresponding voltage is upper case. For example, referring to FIG. 3, the envelope at output port 312a for some arbitrary time t is denoted as $E_p(t)$, whereas the corresponding small-signal envelope is written as $e_p(t)$.

After the reset signal goes LOW, the pre-charge signal $\phi_2$ goes HIGH, causing finite state machine 110 to change state, provided it has not been disabled. For some embodiments, finite state machine 110 is a counter in which it counts down when the pre-charge signal $\phi_2$ goes HIGH, provided it has not been disabled.

During the pre-charge time interval, all switches shown in FIG. 3 are open. In the approximation that the input impedances of inverters 304a and 304b may be taken as infinite, nodes 310a and 310b are floating so that the charges on capacitors 302a and 302b do not change, in which case the voltages at nodes 310a and 310b move up or down depending upon the new values of $e_p(t)$ and $e_N(t)$ during the pre-charge time interval.

That is, for constant charge, the following approximately holds:

$Q=C(e_P(t_0)-V_0)+Q_0=C(e_P(t_1)-V(node310a))+Q_0$, where $t_1$ is now some time value within the pre-charge time interval, and V(node310a) denotes the voltage at node 310a at the end of the pre-charge time interval. From this expression, it is seen that the voltage at node 310a at the end of the pre-charge time interval is given approximately by $e_P(t_1)-e_P(t_0)+V_0$, so that the voltage at node 310a is indicative of the change in the small-signal voltage envelope $e_P(t)$ at output port 312a from the reset time interval to the pre-charge time interval.

Similarly, the voltage at node 310b at the end of the pre-charge time interval is given approximately by $e_N(t_1)-e_N(t_0)+V_0'$, so that the voltage at node 310b is indicative of the change in the small-signal voltage envelope $e_N(t)$ at output port 312b from the reset time interval to the pre-charge time interval.

During the evaluate time interval, switches 308a and 308b are closed, so that inverters 304a and 304b are cross-coupled. For the case in which the amplitude a(t) has increased from the time reset time interval to the pre-charge time interval, $a(t_1)>a(t_0)$, the voltage at node 310a is $|a(t_1)-a(t_0)|$ above $V_0$, the trip-threshold point for inverter 304a, and the voltage at node 310b is $|a(t_1)-a(t_0)|$ below $V_0'$, the trip-threshold point for inverter 304b. Cross-coupled inverters 304a and 304b amplify this difference so that node 314a is brought towards LOW and node 314b is brought towards HIGH.

Comparator 116 is clocked by the evaluate clock signal $\phi_3$ so that finite state machine 110 ignores the output of sampler circuit 114 except during the evaluate time interval. Comparator 116 helps ensure that the signal provided to finite state machine 110 is at a full logic level. For the above case in which the amplitude a(t) has increased from the time reset time interval to the pre-charge time interval, the signal provided by comparator 116 is LOW, and the interface between finite state machine 110 and comparator 116 is designed so that finite state machine 110 is enabled for a LOW control signal.

For the case in which the amplitude a(t) has decreased from the time reset time interval to the pre-charge time interval, $a(t_1)<a(t_0)$, the voltage at node 310a is $|a(t_1)-a(t_0)|$ below $V_0$ and the voltage at node 310b is $|a(t_1)-a(t_0)|$ above $V_0'$. Cross-coupled inverters 304a and 304b amplify this difference so that node 314a is brought towards HIGH and node 314b is brought towards LOW. Comparator 116 provides a HIGH signal to finite state machine 110, and the interface between finite state machine 110 and comparator 116 is designed so that finite state machine 110 is disabled for a HIGH control signal.

Figure 4:
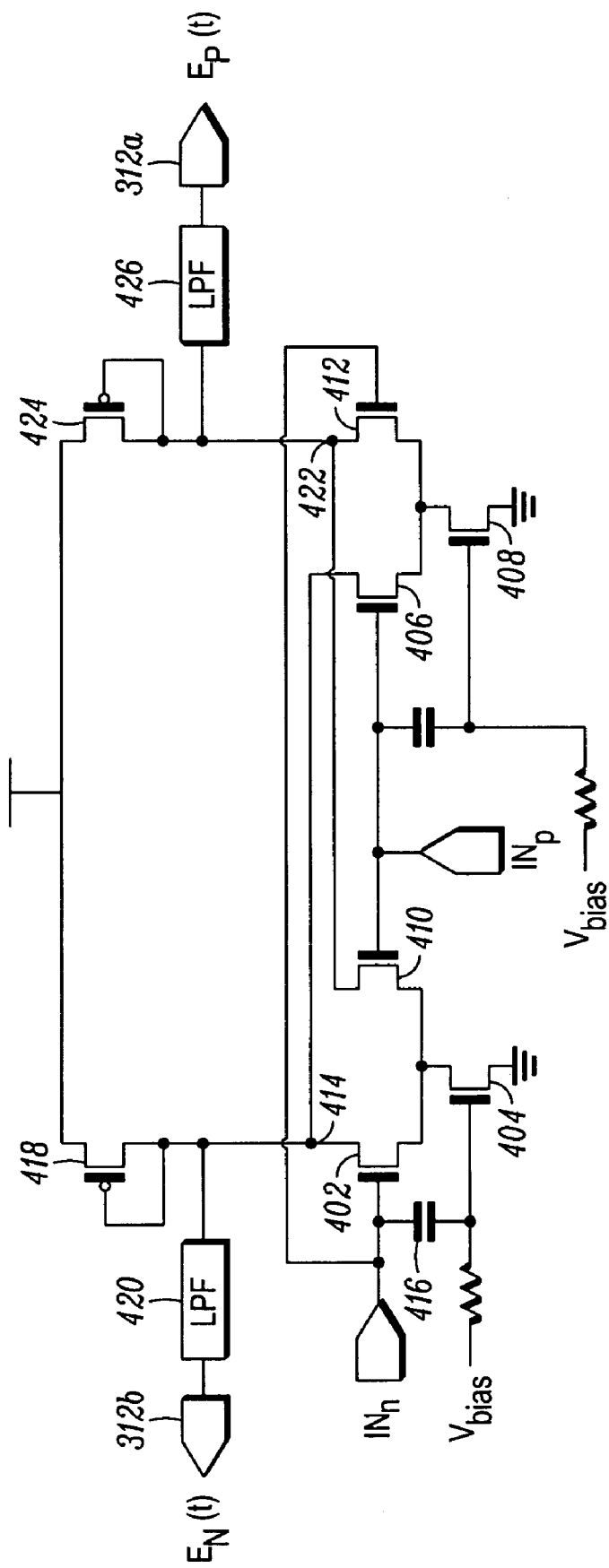

Envelope detector 112 may be implemented in a number of ways. An example of an embodiment is shown in FIG. 4, where the input ports are denoted as $IN_N$ and $IN_P$, and output ports 312a and 312b provide, respectively, the voltages $E_P(t)$ and $E_N(t)$. The circuit of FIG. 4 comprises four so-called Gilbert multipliers: transistors 402 and 404, transistors 406 and 408, transistors 410 and 404, and transistors 412 and 408.

Transistors 402 and 404 form a multiplier to sink a current at node 414 proportional to the square of the voltages on the gates of transistors 402 and 404. With capacitor 416 coupling the gate of transistor 404 to input port $IN_N$, the small-signal current sunk at node 414 by the multiplier comprising transistors 402 and 404 is proportional to the square of the small-signal voltage at input port $IN_N$. Transistors 406 and 408 form a multiplier to also sink current at node 414, but where the small-signal current is proportional to the square of the small-signal voltage at input port $IN_P$. These small-signal currents add at node 414. Diode-connected transistor 418 provides a voltage at node 414 proportional to the square root of the current sunk at node 414. As a result, after applying low pass filter 420, the voltage envelope $E_N(t)$ is provided at output port 312b.

Transistors 410 and 404 form a multiplier to sink at node 422 a small-signal current proportional to the multiplication of the small-signal voltages on input port $IN_P$ and input port $IN_N$, and transistors 412 and 408 form a multiplier to sink at node 422 a small-signal current proportional to the multiplication of the small-signal voltages on input port $IN_N$ and input port $IN_P$. With diode-connected transistor 424 providing a voltage at node 422 proportional to the square of the current sunk at node 422, and low pass filter 426 providing a low pass filtering function to node 422, the voltage envelope $E_P(t)$ is provided at output node 312a.

Transistors 404 and 408 have their gates DC biased at a bias voltage $V_{BIAS}$, so that transistor 404 provides a DC tail current to transistors 402 and 410, and transistor 408 provides a DC tail current to transistors 406 and 412.

Figure 5:
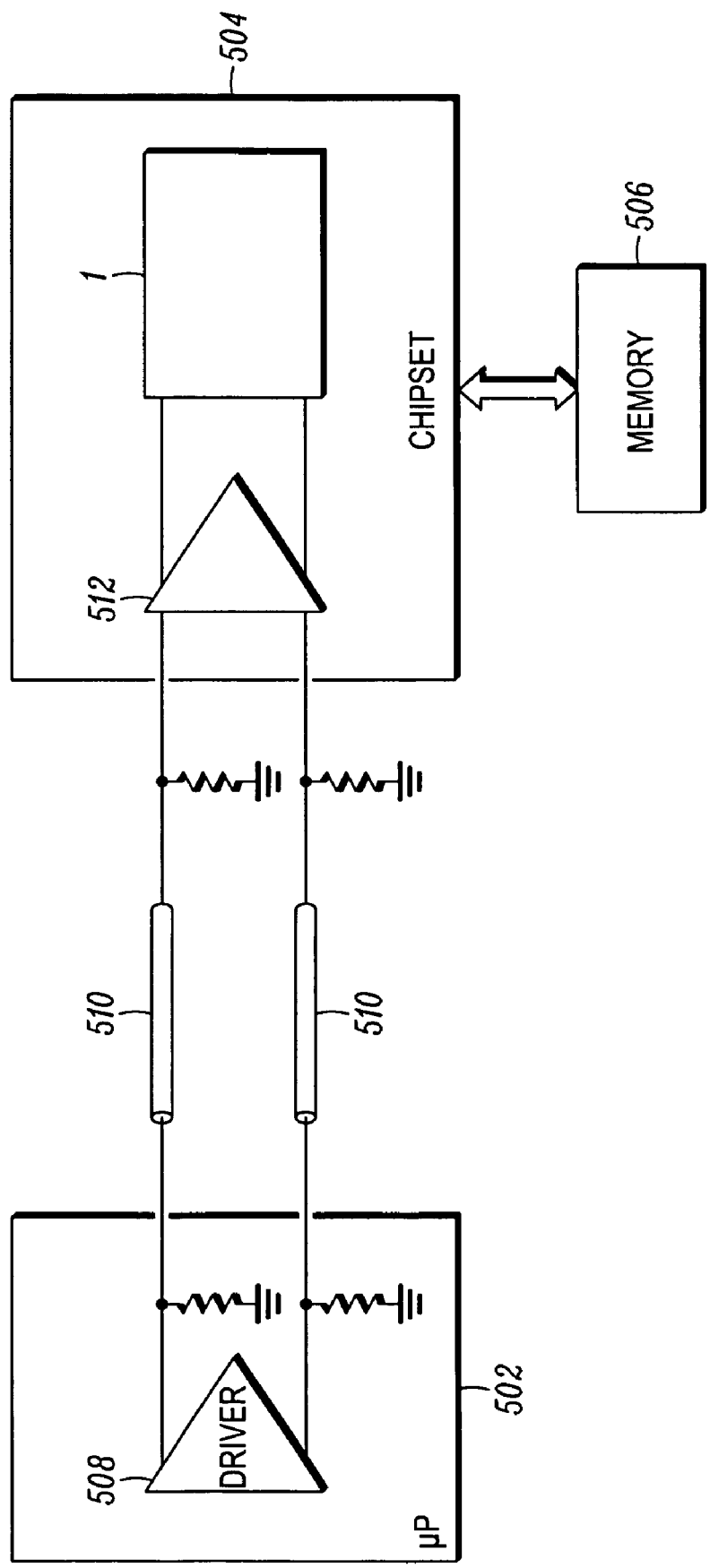
FIG. 5 illustrates an application of some embodiments of the present invention to a computer system.

One particular application of the above-described embodiments is for the amplification of a clock signal communicated from one module to another module via a communication link, such as a point-to-point interconnect or bus. Such a communication link may generally be viewed as a transmission line. As one example, FIG. 5 illustrates a portion of a computer system comprising microprocessor 502, chipset 504, and system memory 506. FIG. 5 is a simplification of a computer system, and in practice, other functional units are most likely employed. Furthermore, some computer systems may employ more than one microprocessor. Some of the functional units in FIG. 5 may be realized by more than one discrete chip. For example, memory 506 may represent a hierarchy of memory functional units, and chipset 504 may be realized by more than one discrete chip. Embodiments of the present invention, represented as embodiment 1 in FIG. 5, may reside in chipset 504, as well as other functional units.

In the example of FIG. 5, driver 508 drives transmission line 510 with a differential clock signal, received by receiver 512, providing the received differential signal to embodiment 1. Embodiments of the present invention may find applications to other systems, and to signals other than clock signals.

Various modifications may be made to the disclosed embodiments without departing from the scope of the invention as claimed below. For example, various actions performed in the embodiments were described depending upon whether various nodes or ports were brought LOW or HIGH. However, these are often merely conventions, and various logic circuits may be designed so that the described actions occur for the complementary case in which a LOW voltage is substituted for a HIGH voltage and a HIGH voltage is substituted for a LOW voltage.

As a particular example, comparator 116 may be designed so that for the case in which the amplitude a(t) has increased from the time reset time interval to the pre-charge time interval, $a(t_1)>a(t_0)$, comparator 116 provides a HIGH signal to finite state machine 110, and an interface circuit between finite state machine 110 and comparator 116 may be designed so that finite state machine 110 is enabled for a HIGH signal. This may be generalized by viewing comparator 116 as providing a Boolean voltage level when the difference in amplitudes $a(t_1)-a(t_0)$ satisfies an ordered relationship with zero, where for some embodiments the Boolean voltage level may be HIGH and the ordered relationship may be >.

As another example, for some embodiments in which finite state machine 110 is a counter, finite state machine 110 may be incremented rather than decremented, so that capacitive circuits are sequentially switched in rather than switched out. In some embodiments, finite state machine 110 may be a counter that is decremented as described earlier, but where capacitive circuits are sequentially switched out rather than switched in. This merely involves designing various interface circuits between finite state machine 110 and amplifier 102. Stated in other words, different correspondences between the state of finite state machine 110 and the set of control voltages $\overline{b}_L$ may be designed. The use of a thermometer encoder described earlier is merely one example of designing such a correspondence.

In other variations in the embodiments, the duals to various circuits may be employed, as is well known in the art of circuit design, where nMOSFETs are substituted for pMOSFETs, and pMOSFETs are substituted for nMOSFETs. For example, for amplifier 102, pMOSFETs rather than nMOSFETS may be used for a differential pair.

Other embodiments may utilize other types of digitally controlled tunable band-pass amplifiers than the one illustrated in FIG. 2. The embodiment of FIG. 2 is an example of a tunable band-pass amplifier in which tuning is achieved by digitally changing the reactance of its load by switching in various capacitors. However, other tunable band-pass amplifiers may be employed, where the peak frequency is tuned in a manner different from the particular embodiment of FIG. 2. For example, digitally controlled current sources, or current mirrors, may be used to change various bias currents in an amplifier so as to tune its peak frequency. Accordingly, the scope of the claims below are not necessarily limited to tunable band-pass amplifiers having a tunable reactive load, but may encompass other types of amplifiers having a tunable peak frequency that is digitally controlled.

It is to be understood in these letters patent that the meaning of "A is connected to B", where A or B may be, for example, a node or device terminal, is that A and B are connected to each other so that the voltage potentials of A and B are substantially equal to each other. For example, A and B may be connected together by an interconnect (transmission line). In integrated circuit technology, the interconnect may be exceedingly short, comparable to the device dimension itself. For example, the gates of two transistors may be connected together by polysilicon, or copper interconnect, where the length of the polysilicon, or copper interconnect, is comparable to the gate lengths. As another example, A and B may be connected to each other by a switch, such as a transmission gate, so that their respective voltage potentials are substantially equal to each other when the switch is ON.

It is also to be understood in these letters patent that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element, which in turn is connected to B.

It is also to be understood in these letters patent that a "current source" may mean either a current source or a current sink. Similar remarks apply to similar phrases, such as, "to source current".

It is also to be understood in these letters patent that various circuit blocks, such as current mirrors, amplifiers, etc., may include switches so as to be switched in or out of a larger circuit, and yet such circuit blocks may still be considered connected to the larger circuit because the various switches may be considered as included in the circuit block.

What is claimed is:

1. A circuit comprising:
   an amplifier to provide an output signal, the amplifier having a tunable peak frequency;
   a finite state machine, having a set of states, to tune the peak frequency of the amplifier in response to sequencing through states in the set of states; and
   a control circuit to provide a signal indicative of the difference in amplitudes of the output signal over two consecutive time intervals, and to disable the finite state machine from sequencing through the states when the difference in amplitudes satisfies an ordered relationship with zero.

2. The circuit as set forth in claim 1, wherein the ordered relationship is satisfied if the difference in amplitudes is less than zero.

3. The circuit as set forth in claim 1, wherein the output signal is a differential signal.

4. The circuit as set forth in claim 1, wherein the finite state machine comprises a counter.

5. The circuit as set forth in claim 1, the amplifier further comprising a tunable reactive load.

6. The circuit as set forth in claim 5, the tunable reactive load comprising a set of capacitive circuits, the counter having a counter value and coupled to the tunable reactive load so that the capacitance of the tunable reactive load decreases as the counter value decreases.

7. A computer system comprising:
   a transmission line;
   a microprocessor comprising a driver to drive the transmission line;
   a memory;
   a chipset coupled to the transmission line and to the memory, the chipset comprising:
      an amplifier to provide an output signal, the amplifier having a tunable peak frequency;
      a finite state machine, having a set of states, to tune the amplifier in response to sequencing through states in the set of states; and
      a control circuit to provide a signal indicative of the difference in amplitudes of the output signal at a first time and a second time subsequent to the first time, and to disable the finite state machine from sequencing through the states when the difference in amplitudes satisfies an ordered relationship with zero.

8. The computer system as set forth in claim 7, wherein the ordered relationship is satisfied if the difference in amplitudes is less than zero.

9. The computer system as set forth in claim 7, wherein the output signal is a differential signal.

10. The computer system as set forth in claim 7, wherein the finite state machine comprises a counter.

11. The computer system as set forth in claim 10, the amplifier comprising a tunable reactive load comprising a set of capacitive circuits, the counter having a counter value and coupled to the tunable reactive load so that the capacitance of the tunable reactive load decreases as the counter value decreases.

* * * * *